(12) United States Patent
Otremba et al.

(10) Patent No.: US 11,217,510 B2
(45) Date of Patent: Jan. 4, 2022

(54) SEMICONDUCTOR DEVICE INCLUDING A BIDIRECTIONAL SWITCH (71) Applicant: Infineon Technologies Austria AG, Villach (AT)

(72) Inventors: Ralf Otremba, Kaufbeuren (DE); Klaus Schiess, Allensbach (DE); Michael Treu, Villach (AT)

(73) Assignee: Infineon Technologies Austria AG, Villach (AT)

( * ) Notice: Subject to any disclaimer, the term of this patent is extended or adjusted under 35 U.S.C. 154(b) by 340 days.

(21) Appl. No.: 15/825,486

(22) Filed: Nov. 29, 2017

(65) Prior Publication Data
US 2018/0151481 A1 May 31, 2018

(30) Foreign Application Priority Data

Nov. 29, 2016 (DE) .......................... 102016122963.6

(51) Int. Cl.
*H01L 23/495* (2006.01)
*H01L 23/00* (2006.01)
(Continued)

(52) U.S. Cl.
CPC .... *H01L 23/49562* (2013.01); *H01L 23/4952* (2013.01); *H01L 23/49537* (2013.01); *H01L 23/49548* (2013.01); *H01L 23/49555* (2013.01); *H01L 23/49575* (2013.01); *H01L 24/48* (2013.01); *H01L 24/49* (2013.01); *H01L 23/3107* (2013.01); *H01L 23/3121* (2013.01); *H01L 23/49558* (2013.01); *H01L 29/2003* (2013.01); *H01L 2224/48091* (2013.01); *H01L 2224/48137* (2013.01); *H01L 2224/48175* (2013.01); *H01L 2224/49111* (2013.01); *H01L 2224/49112* (2013.01); *H01L 2224/49171* (2013.01); *H01L 2224/49175* (2013.01); *H01L 2924/00014* (2013.01); *H01L 2924/13055* (2013.01)

(58) Field of Classification Search
CPC ........................ H01L 23/3121; H01L 23/4952
See application file for complete search history.

(56) References Cited

U.S. PATENT DOCUMENTS 9,263,563 B2 2/2016 Otremba et al.
2004/0124474 A1 7/2004 Kitabatake et al.
(Continued)

FOREIGN PATENT DOCUMENTS

CN 1508883 A 6/2004
CN 1691327 A 11/2005
(Continued)

*Primary Examiner* — Douglas M Menz
(74) *Attorney, Agent, or Firm* — Murphy, Bilak & Homiller, PLLC (57) ABSTRACT

A semiconductor device forming a bidirectional switch includes a carrier, first and second semiconductor elements arranged on the carrier, a first row of terminals arranged along a first side face of the carrier, a second row of terminals arranged along a second side face of the carrier opposite the first side face, and an encapsulation body encapsulating the first and second semiconductor elements. Each row of terminals includes a gate terminal, a sensing terminal and at least one power terminal of the bidirectional switch.

6 Claims, 5 Drawing Sheets

(51) Int. Cl.
*H01L 23/31* (2006.01)
*H01L 29/20* (2006.01)

(56) References Cited

U.S. PATENT DOCUMENTS

| | | |
|---|---|---|
| 2006/0118866 A1 | 6/2006 | Yanagida et al. |
| 2010/0213510 A1* | 8/2010 | Osawa .............. H01L 23/49562 |
| | | 257/146 |
| 2011/0204807 A1* | 8/2011 | Hashizume ....... H01L 29/42316 |
| | | 315/246 |
| 2016/0020276 A1* | 1/2016 | Lu ....................... H01L 29/0653 |
| | | 257/77 |

FOREIGN PATENT DOCUMENTS

| | | |
|---|---|---|
| CN | 1776911 A | 5/2006 |
| DE | 102007016901 A1 | 10/2008 |
| DE | 102014115717 A1 | 4/2015 |
| WO | 2004107442 A1 | 12/2004 |

* cited by examiner

SEMICONDUCTOR DEVICE INCLUDING A BIDIRECTIONAL SWITCH

BACKGROUND

Bidirectional switches offer many advantageous electrical properties which make them useful in a wide array of applications. Of particular interest are bidirectional switches that are realized in one single semiconductor device (semiconductor package). However, current bidirectional switches realized in that manner may not exhibit a sufficiently high power density. Furthermore, it may be desirable to reduce package size and/or the cost of production of such bidirectional switches.

SUMMARY

According to an embodiment of a semiconductor device forming a bidirectional switch, the semiconductor device comprises: a carrier; a first semiconductor chip and a second semiconductor chip arranged on the carrier; a first row of terminals arranged along a first side face of the carrier; a second row of terminals arranged along a second side face of the carrier opposite the first side face; and an encapsulation body encapsulating the first and the second semiconductor chips. The first semiconductor chip comprises a first transistor structure comprising first source, drain and gate electrodes. The second semiconductor chip comprises a second transistor structure comprising second source, drain and gate electrodes. The first and the second transistor structures are coupled with each other by the respective first and second drain electrodes via the carrier. The first row of terminals comprises a first gate terminal coupled with the first gate electrode, a first sensing terminal coupled with the first source electrode, and a first power terminal of the bidirectional switch coupled with the first source electrode. The second row of terminals comprises a second gate terminal coupled with the second gate electrode, a second sensing terminal coupled with the second source electrode, and a second power terminal of the bidirectional switch coupled with the second source electrode. The carrier and the first and the second rows of terminals are parts of a leadframe.

According to another embodiment of a semiconductor device forming a bidirectional switch, the semiconductor device comprises: a first carrier; a second carrier; a first semiconductor chip arranged on the first carrier; a second semiconductor chip arranged on the second carrier; an encapsulation body encapsulating the first and the second semiconductor chips; a first row of terminals arranged along a first side face of the encapsulation body; and a second row of terminals arranged along a second side face of the encapsulation body opposite the first side face. The first semiconductor chip comprises a first transistor structure comprising first source, drain and gate electrodes. The second semiconductor chip comprises a second transistor structure comprising second source, drain and gate electrodes. The first and the second transistor structures are coupled with each other by the respective first and second source electrodes. The first row of terminals comprises a first gate terminal coupled with the first gate electrode, a first sensing terminal coupled with the first source electrode, and a first power terminal coupled with the first drain electrode. The second row of terminals comprises a second gate terminal coupled with the second gate electrode, a second sensing terminal coupled with the second source electrode, and a second power terminal of the bidirectional switch coupled with the second drain electrode.

According to yet another embodiment of a semiconductor device forming a bidirectional switch, the semiconductor device comprises: a carrier; a semiconductor element arranged on the carrier; a first row of terminals arranged along a first side face of the carrier; a second row of terminals arranged along a second side face of the carrier opposite the first side face; and an encapsulation body encapsulating the semiconductor element. The semiconductor element comprises a first transistor structure comprising first source and gate electrodes and a second transistor structure comprising second source and gate electrodes, the first and the second transistor structures comprising a common drain electrode. The first row of terminals comprises a first gate terminal coupled with the first gate electrode, a first sensing terminal coupled with the first source electrode, and a first power terminal of the bidirectional switch coupled with the first source electrode. The second row of terminals comprises a second gate terminal coupled with the second gate electrode, a second sensing terminal coupled with the second source electrode, and a second power terminal of the bidirectional switch coupled with the second source electrode.

Those skilled in the art will recognize additional features and advantages upon reading the following detailed description, and upon viewing the accompanying drawings.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings. It may be evident, however, to one skilled in the art that one or more aspects of the examples may be practiced with a lesser degree of the specific details. In other instances, known structures and elements are shown in schematic form in order to facilitate describing one or more aspects of the examples. In this regard, directional terminology, such as "top", "bottom", "left", "right", "upper", "lower" etc., is used with reference to the orientation of the Figure(s) being described. Because components of examples can be positioned in a number of different orientations, the directional terminology is used for purposes of illustration and is in no way limiting. It is to be understood that other examples may be utilized and structural or logical changes may be made without departing from the scope of the disclosure. The following detailed description, therefore, is not to be taken in a limiting sense, and the scope of the disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise" The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal.

The examples of a semiconductor device and a method for fabricating a semiconductor device may use various types of semiconductor chips or circuits incorporated in the semiconductor chips, among them power MOS transistors, power Schottky diodes, JFETs (Junction Gate Field Effect Transistors), power bipolar transistors, logic integrated circuits, analogue integrated circuits, power integrated circuits, chips with integrated passives, etc. The examples may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip. Moreover, the examples of insulation materials may, for example, be used for providing insulation layers in various types of enclosures and insulation for electrical circuits and components, and/or for providing insulation layers in various types of semiconductor chips or circuits incorporated in semiconductor chips, including the above mentioned semiconductor chips and circuits.

The semiconductor chip(s) can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor chip(s) considered herein may be thin, in particular thinner than 100 µm, 50 µm, 20 µm, or 10 µm. In order to allow handling or manipulation of the semiconductor chip, e.g. handling/manipulation required for packaging, eWLP (embedded Wafer Level Packaging), or semiconductor device assembly, the semiconductor chip may form part of a composite chip. A composite chip may comprise the semiconductor chip and a reinforcing chip secured to the semiconductor chip. The reinforcing chip adds stability and/or strength to the composite chip to make it manageable.

The semiconductor chip(s) may have contact pads (or electrodes) which allow electrical contact to be made with the integrated circuits included in the semiconductor chip(s). The electrodes may be arranged all at only one main face(s) of the semiconductor chip(s) or at both main faces of the semiconductor chip(s). They may include one or more electrode metal layers which are applied to the semiconductor material of the semiconductor chip(s). The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

The semiconductor chip(s) may be bonded to a carrier. The carrier may be a (permanent) device carrier used for packaging. The carrier may comprise or consist of any sort of material as, for example, ceramic or metallic material, copper or copper alloy or iron/nickel alloy. The carrier may for example comprise one or more of a Direct-Aluminum-Bond (DAB), a Direct-Copper-Bond (DCB) or a leadframe. The carrier can be connected mechanically and electrically with one contact element of the semiconductor chip(s). The semiconductor chip(s) can be connected to the carrier by one or more of re-flow soldering, vacuum soldering, diffusion soldering, or adhering by means of a conductive adhesive. If diffusion soldering is used as the connection technology between the semiconductor chip(s) and the carrier, solder materials can be used which result in inter-metallic phases at the interface between the semiconductor and the carrier due to interface diffusion processes after the soldering process. In case of copper or iron/nickel carriers it may therefore be desirable to use solder materials comprising or consisting of AuSn, AgSn, CuSn, AgIn, AuIn or CuIn. Alternatively, if the semiconductor chip(s) are to be adhered to the carrier, conductive adhesives can be used. The adhesives can, for example, be based on epoxy resins which can be enriched with particles of gold, silver, nickel or copper to enhance their electrical conductivity.

The semiconductor chip(s) may be covered with an encapsulation material forming an encapsulation body after being bonded to a carrier (substrate). The encapsulation material may be electrically insulating. The encapsulation material may comprise or be made of any appropriate ceramic, plastic or polymer material such as, e.g., a duroplastic, thermoplastic or thermosetting material or laminate (prepreg), and may e.g. contain filler materials. Various techniques may be employed to encapsulate the semiconductor chip(s) with the encapsulation material, for example compression molding, injection molding, powder molding, liquid molding or lamination. Heat and/or pressure may be used to apply the encapsulation material.

In several examples layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

In the following examples of a semiconductor device forming a bidirectional switch are described. A bidirectional switch may behave like a transistor in both directions of an electrical circuit. The semiconductor device may be a discrete component and may be a Surface Mounted Device (SMD). In the Figures examples of a semiconductor device are shown, wherein the semiconductor device is a SMD comprising gull-wing terminals. However, the semiconductor device may also be a leadless SMD or a Through Hole Device (THD) without departing from the scope of the disclosure.

A semiconductor device according to the disclosure may comprise a first row of terminals and a second row of terminals, wherein the first and second rows are arranged along opposing side faces of an encapsulation body of the semiconductor device or along opposing side faces of a carrier of the semiconductor device. The semiconductor device may for example comprise a Dual Small Outline (DSO) package, a Thin Shrink Small Outline Package (TSSOP), a Transistor Outline LeadLess (TOLL) package, a Dual Flat No-lead (DFN) package, a Dual Inline Package (DIP), a Shrink Dual Inline Package (SDIP) or any other suitable package.

Each row of terminals may comprise a suitable number of terminals, for example each row may comprise five terminals or eight terminals or thirteen terminals. The number of terminals may depend on the package used in the particular example of a semiconductor device according to the disclosure. The number of terminals may follow an industrial standard according to the package type. Furthermore, a spacing between the terminals of a row of terminals may follow the industrial standard and may for example be 0.65 mm, 1.27 mm, 2.54 mm or any other suitable spacing. A distance between the first and second row of terminals (width of the encapsulation body) as well may follow the industrial standard and may for example be 7.62 mm or 15.24 mm or any other suitable distance. The industrial standard may be a JEDEC standard.

A semiconductor device forming a bidirectional switch according to the disclosure may advantageously exhibit high electrical power density, ease of manufacture, low cost of manufacture and/or compatibility with existing technologies.

An example of a semiconductor device according to the disclosure comprises a first and a second semiconductor chip which are electrically coupled to form a bidirectional switch. The first and second semiconductor chips may be identical chips. The first and second semiconductor chips may be arranged on a common carrier and may be electrically coupled via the common carrier. Alternatively, the first and second semiconductor chips may be arranged on two distinct carriers that are physically separated from one another and the semiconductor chips may be coupled by a conductive element like one or more bonding wires or a contact clip. The semiconductor chips may be electrically coupled via their respective source electrodes or via their respective drain electrodes. The first and second semiconductor chips may for example be Si chips.

According to an example of a semiconductor device according to the disclosure, the first and second semiconductor chips are implemented monolithically. That is, the semiconductor device comprises one integral semiconductor substrate that comprises both the first semiconductor chip and the second semiconductor chip. Such a monolithic substrate may for example be obtained by separating chip pairs from a wafer instead of individual chips.

Alternatively, an example of a semiconductor device according to the disclosure comprises a single semiconductor chip to form a bidirectional switch. The single semiconductor chip may be a III-V semiconductor chip, for example a GaN chip.

According to an example of a semiconductor device according to the disclosure, the semiconductor chip(s) may be arranged on a first main face of a carrier and a second main face of the carrier opposite the first main face may be exposed from an encapsulation body of the semiconductor device, for example on a main face of the encapsulation body. The exposed part of the carrier may be configured to be connected to a heatsink. An electrically insulating layer may be arranged between the carrier and the heatsink. The insulating layer may for example comprise an insulating foil.

Figure 1A:
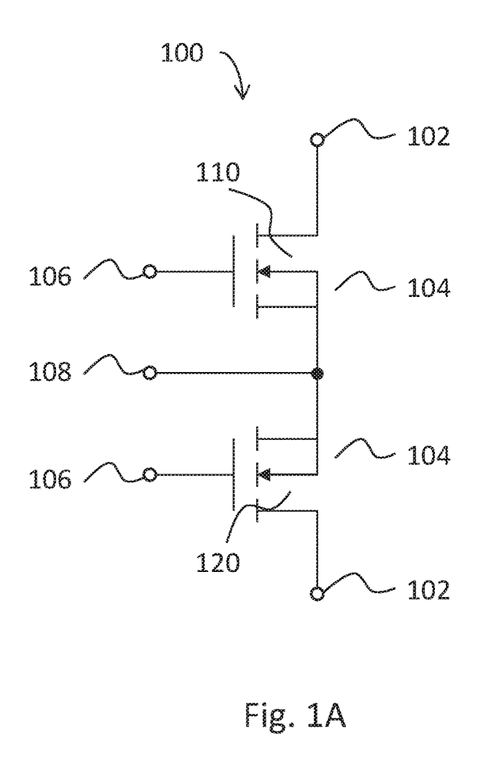
FIGS. 1A and 1B show circuit diagrams of two different examples of a bidirectional switch according to the disclosure.

FIG. 1A shows an electrical circuit diagram of a bidirectional switch 100. The bidirectional switch 100 comprises a first transistor structure 110 and a second transistor structure 120, wherein the first and second transistor structures 110, 120 are coupled via respective source contacts 104. The bidirectional switch 100 further comprises drain contacts 102, gate contacts 106 and at least one sensing contact 108, wherein the sensing contact 108 is coupled to the source contacts 104.

The drain contacts 102, the gate contacts 106 and the sensing contact 108 may be coupled to respective (outer) terminals of a semiconductor device comprising the bidirectional switch 100.

Figure 1B:
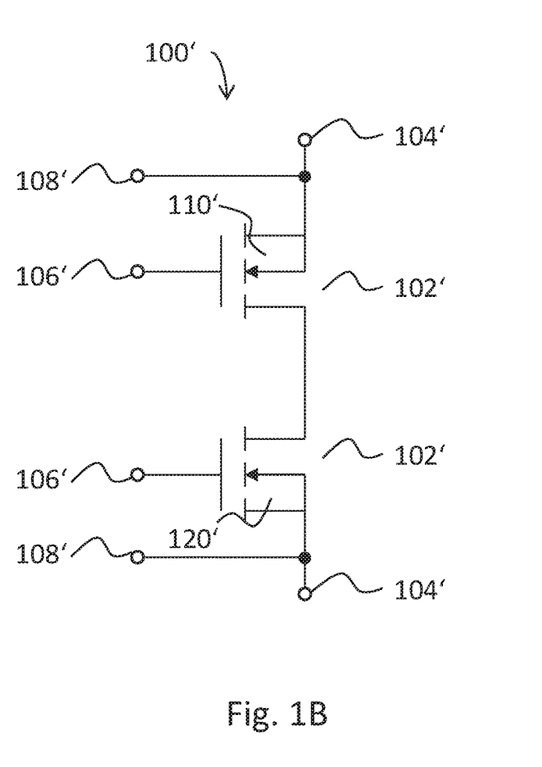

FIG. 1B shows an electrical circuit diagram of a bidirectional switch 100'. The bidirectional switch 100' may be identical to the bidirectional switch 100 except for the fact that first and second transistor structures 110',120' of the bidirectional switch 100' are coupled via respective drain contacts 102'. Source contacts 104', gate contacts 106' and sensing contacts 108' may be coupled to respective (outer) terminals of a semiconductor device comprising the bidirectional switch 100'.

In the following examples of a semiconductor device comprising the bidirectional switch 100 or the bidirectional switch 100' are shown.

FIGS. 2A through 2D show various examples of semiconductor package forms suitable for a semiconductor device according to the disclosure.

Figure 2A:
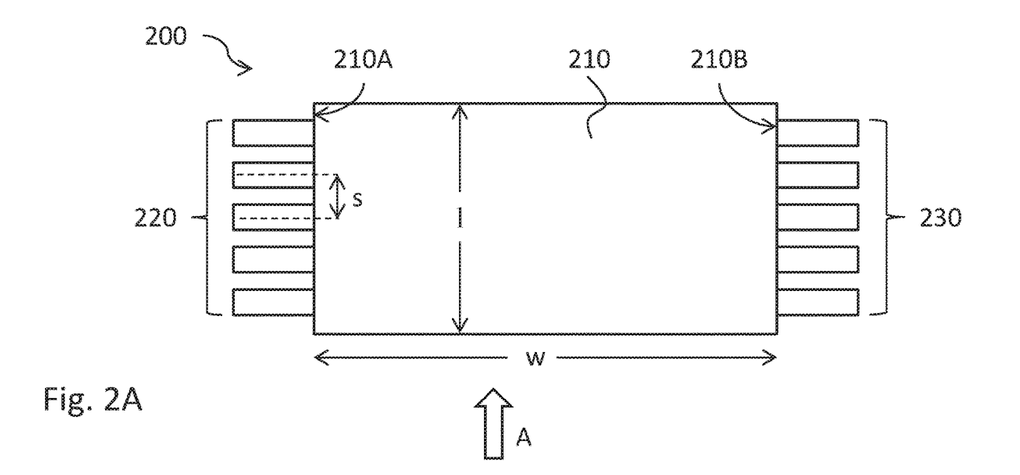
FIGS. 2A through 2D schematically show examples of semiconductor packages that may be used to realize a bidirectional switch in top view (FIG. 2A) and side view (FIG. 2B-2D).

FIG. 2A shows a top view of a semiconductor device 200 comprising an encapsulation body 210 and a first row of (outer) terminals 220 and a second row of (outer) terminals 230 opposite the first row. The first row of terminals 220 is arranged along a first side face 210A of the encapsulation body 210 and the second row of terminals 230 is arranged along a second side face 210B of the encapsulation body 210 opposite the first side face 210A.

FIG. 2A shows the first and second rows of terminals 220, 230 to comprise five terminals each. However, semiconductor device 200 may comprise any suitable number of terminals. The first and second rows of terminals 220, 230 may comprise an identical number of terminals. Each terminal of the first row of terminals 220 may be arranged exactly opposite the respective terminal of the second row of terminals 230 (that is, arranged without a lateral displacement).

A spacing s between neighboring terminals may be identical for all pairs of neighboring terminals. The spacing s may be identical for both rows of terminals 220, 230. The spacing s may have the numerical values described further above.

A length l and a width w of the encapsulation body 210 may depend on the package type used in the semiconductor device 200 as described further above. The width w may be larger than the length l and may depend on the package type. For example, the encapsulation body 210 may be about twice as wide as long. The length l may depend on the number of terminals in the rows of terminals 220, 230.

Figure 2B:
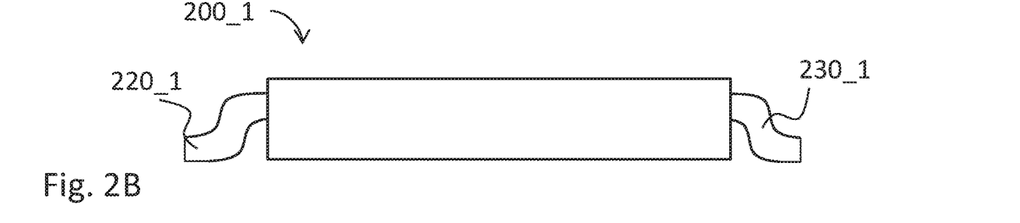

FIG. 2B shows a side view of a semiconductor device 200_1. The semiconductor device 200_1 may correspond to the semiconductor device 200 and FIG. 2B may be a side view along the arrow A of FIG. 2A.

The semiconductor device 200_1 comprises a SMD type package, wherein terminals 220_1 and 230_1 are gull-wing type terminals.

Figure 2C:
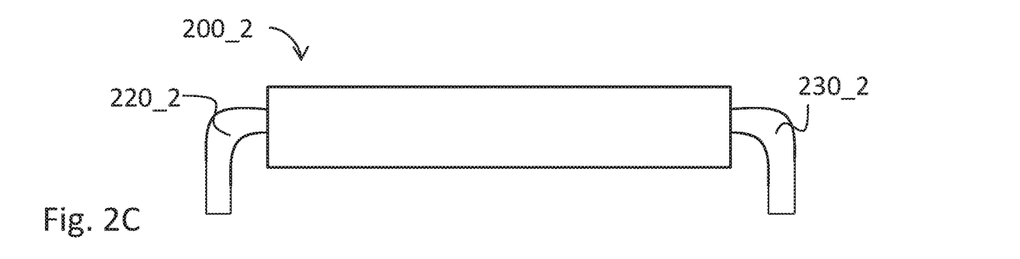

FIG. 2C shows a side view of a semiconductor device 200_2. The semiconductor device 200_2 may correspond to the semiconductor device 200 and FIG. 2C may be a side view along the arrow A of FIG. 2A.

The semiconductor device 200_2 comprises a THD type package, wherein terminals 220_2 and 230_2 are bent downwards and configured to be inserted into through-holes of a substrate.

Figure 2D:
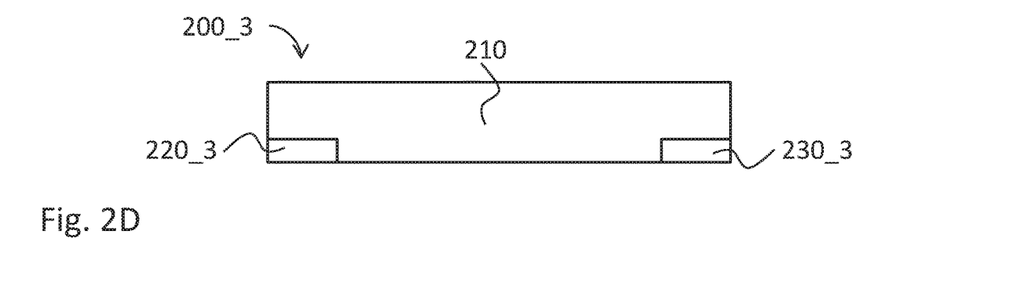

FIG. 2D shows a side view of a semiconductor device 200_3. The semiconductor device 200_3 may correspond to the semiconductor device 200 and FIG. 2D may be a side view along the arrow A of FIG. 2A.

The semiconductor device 200_3 comprises a leadless type package, wherein terminals 220_3 and 230_3 do not extend beyond an outline of the encapsulation body 210 (therefore, in the case of the semiconductor device 200_3 the terminals 220_3, 230_3 are not visible in the top view of FIG. 2A).

In the following for the sake of brevity examples of semiconductor devices comprising a bidirectional switch are only shown using SMD type packages like the one of FIG. 2B. However, a THD type package or a leadless package like the ones shown in FIGS. 2C and 2D can also be used.

Figure 3A:
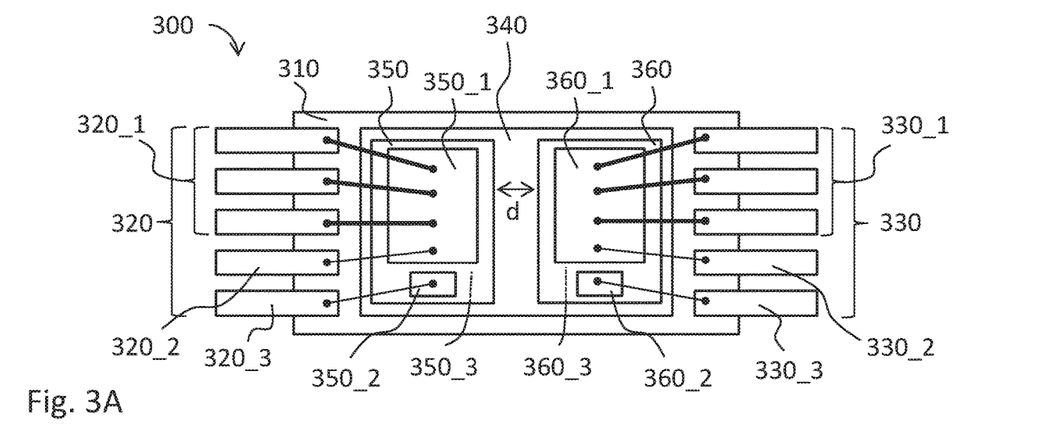
FIGS. 3A through 3C schematically show top views (FIG. 3A, 3B) and a side view (FIG. 3C) of examples of semiconductor devices realizing a bidirectional switch, wherein the semiconductor devices comprise two semiconductor elements.

FIG. 3A shows an example of a semiconductor device 300 according to the disclosure. The semiconductor device 300 may comprise an encapsulation body 310, a first row of terminals 320, a second row of terminals 330, a carrier 340, a first semiconductor element 350 and a second semiconductor element 360. The first and second semiconductor elements 350, 360 may be semiconductor chips. One or more of the first and second rows of terminals 320, 330 and the carrier 340 may be parts of a leadframe.

The first semiconductor element 350 may comprise a first transistor structure, for example a vertical transistor structure. The first semiconductor element 350 may comprise a first electrode 350_1 and a second electrode 350_2 arranged on an upper main face of the first semiconductor element 350 and a third electrode 350_3 arranged on a lower main face of the first semiconductor element 350 opposite the upper main face. The first electrode 350_1 may be a source electrode, the second electrode 350_2 may be a gate electrode and the third electrode 350_3 may be a drain electrode of the first transistor structure.

The first electrode 350_1 may be coupled to at least one first terminal 320_1 and to a second terminal 320_2 of the first row of terminals 320. The second electrode 350_2 may be coupled to a third terminal 320_3 of the first row of terminals 320. For example, the first and second electrodes 350_1, 350_2 may be coupled to the terminals 320 via bonding wires. The third electrode 350_3 is electrically coupled to the carrier 340.

The second semiconductor element 360 may comprise a second transistor structure identical with the first transistor structure with identical first, second and third electrodes 360_1, 360_2 and 360_3. The first, second and third electrodes 360_1, 360_2 and 360_3 are coupled to the terminals 330 and carrier 340 in a similar manner as described with respect to the first semiconductor element 350.

An at least one first bonding wire coupling the first electrodes 350_1, 360_1 to the respective at least one first terminals 320_1, 330_1 may be configured to support a higher current flow than second and third bonding wires coupling the first electrodes 350_1, 360_1 and second electrodes 350_2, 360_2 to the respective second and third terminals 320_2, 330_2 and 320_3, 330_3. For example, the at least one first bonding wire may have a larger diameter than the second and third bonding wires. The diameter of the at least one first bonding wire may be for example about 500 μm.

Figure 5:
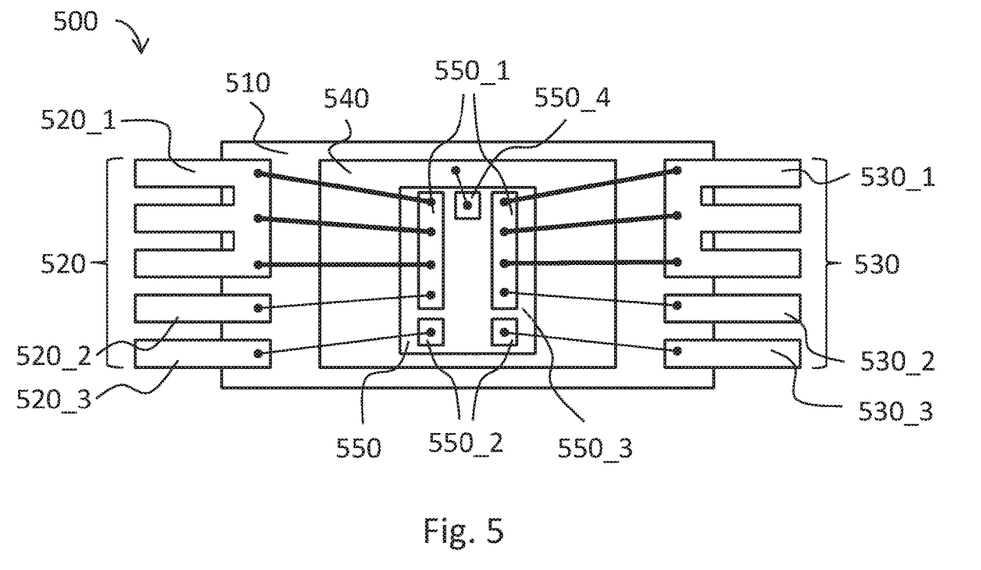
FIG. 5 schematically shows a top view of an example of a semiconductor device realizing a bidirectional switch with a single semiconductor element.

The at least one first terminals 320_1, 330_1 may comprise several single terminals each, for example three single terminals each as shown in FIG. 3A. However, the at least one first terminals 320_1, 330_1 may also each comprise terminals made of one contiguous part as shown in FIG. 5 for terminals 520_1, 530_1.

The semiconductor device 300 may form a bidirectional switch like the bidirectional switch 100' of FIG. 1B. The at least one first terminals 320_1, 330_1 may be power terminals (e.g. source terminals), the second terminals 320_2, 330_2 may be sensing terminals and the third terminals 320_3, 330_3 may be gate terminals of the bidirectional switch of semiconductor device 300.

Figure 3B:
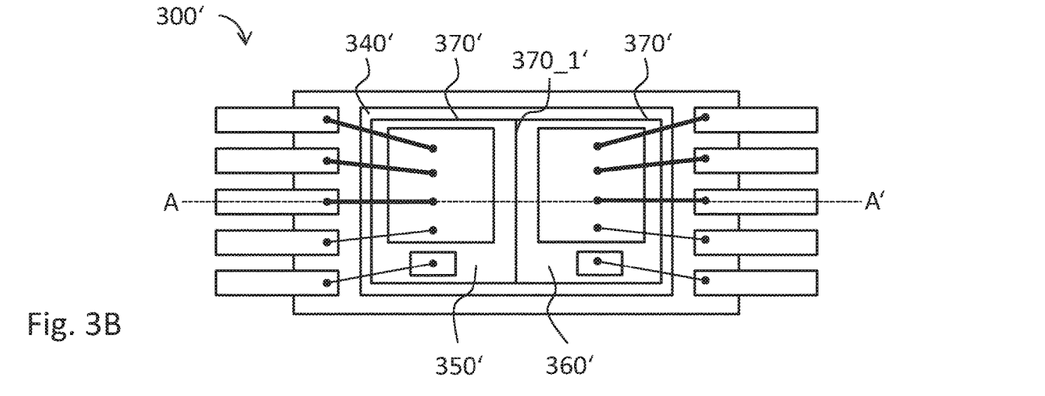

FIG. 3B shows a further example of a semiconductor device 300' according to the disclosure. The semiconductor device 300' is identical to the semiconductor device 300 except for the fact that the first and second semiconductor elements 350',360' of semiconductor device 300' are formed monolithically in one semiconductor substrate 370'.

The first and second semiconductor elements 350',360' are not electrically coupled to one another inside the semiconductor substrate 370' but are insulated from one another along line 3701'. The first and second semiconductor elements 350',360' are only electrically coupled by their respective drain electrodes via carrier 340' similar to the semiconductor device 300.

The monolithic implementation of semiconductor elements 350',360' may offer the advantage that a larger chip size may be possible without increasing the package size than in the case that two distinct semiconductor chips are used like in semiconductor device 300. In the case that two distinct semiconductor chips are used, solder bleedout has to be taken into account and consequently the two chips have to be placed apart by at least a minimum distance d (see FIG. 3A) such that the solder bleedouts of the two solder deposits (one for each chip) do not commingle. The minimum distance d may e.g. be in the range of 0.5 mm-1 mm. The monolithic implementation of semiconductor elements 350', 360' may require only a single solder deposit and may allow for up to 50% increase in chip size which in turn may improve the electrical performance of the semiconductor package by up to 50%.

Figure 3C:
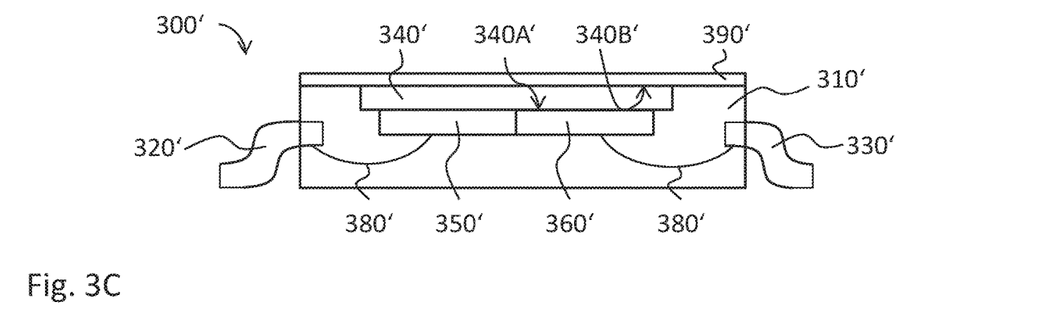

FIG. 3C shows a side view of semiconductor device 300' along the line A-A'. The semiconductor elements 350',360' are arranged on a first main face 340A' of the carrier 340'. An opposing second main face 340B' of the carrier 340' is exposed on an upper main face of the encapsulation body 310' and may be coplanar with the upper main face of the encapsulation body 310'. An insulating layer 390' may be arranged on the second main face 340B' of the carrier 340' and may also be arranged on a part or on the entirety of the upper main face of the encapsulation body 310' as shown in FIG. 3C.

Figure 4A:
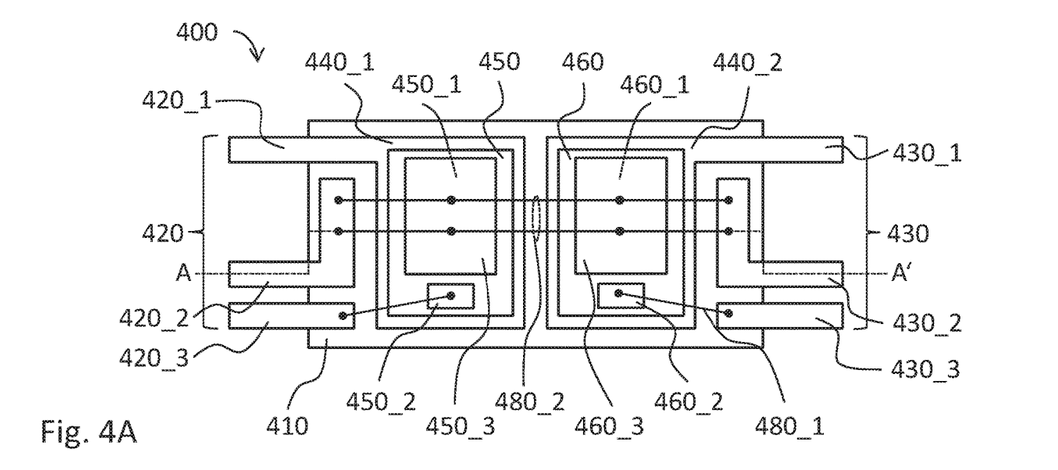
FIGS. 4A and 4B schematically show a further example of a semiconductor device with two semiconductor elements realizing a bidirectional switch in top view (FIG. 4A) and side view (FIG. 4B).

FIG. 4A shows an example of a semiconductor device 400 according to the disclosure. The semiconductor device 400 may form a bidirectional switch like the bidirectional switch 100 of FIG. 1. The composition of the semiconductor device 400 may be largely similar to the composition of the semiconductor device 300 and corresponding parts are designated with reference numerals having identical second and third digits.

The semiconductor device 400 comprises a first semiconductor chip 450 arranged on a first carrier 440_1 and a second semiconductor chip 460 arranged on a second carrier 440_2, wherein the first and second carriers 440_1, 440_2 are electrically physically separated from one another. First electrodes 450_1 and 460_1 are arranged on the lower main face of the semiconductor chips 450, 460 and are electrically coupled to the first and second carriers 440_1, 440_2, respectively.

According to an example the first electrodes 450_1, 460_1 may be drain electrodes, the second electrodes 450_2, 460_2 may be gate electrodes and the third electrodes 450_3, 460_3 may be source electrodes.

The semiconductor device 400 further comprises first terminals 420_1, 430_1, second terminals 420_2, 430_2 and third terminals 420_3, 430_3. Second electrodes 450_2 and 460_2 are arranged on the upper main face of the semiconductor chips 450, 460 and are coupled to the third terminals 420_3, 430_3, respectively by first bonding wires 480_1. Third electrodes 450_3, 460_3 are also arranged on the upper main face of the semiconductor chips 450, 460 and are coupled to one another and to the second terminals 420_2, 430_2 by at least one second bonding wire 480_2.

For example two second bonding wires 480_2 may be used (as shown in FIG. 4A), or three or four or any other suitable number of second bonding wires 480_2 to provide an electrical connection of satisfactory quality.

Figure 4B:
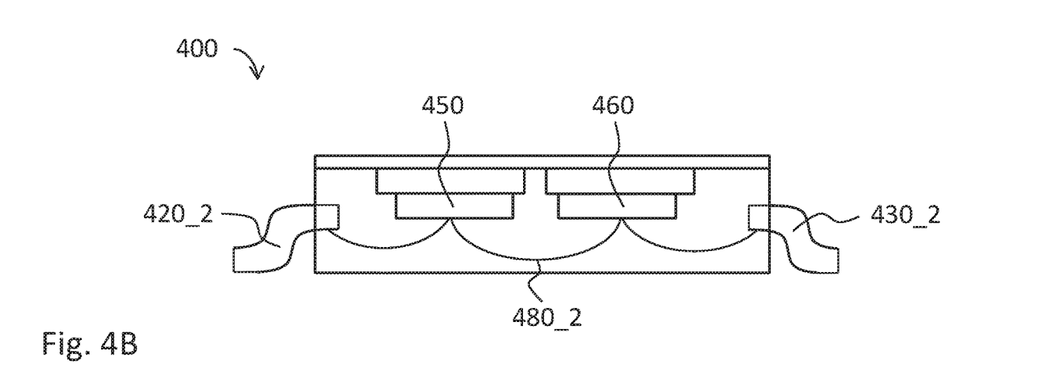

According to one example the at least one second bonding wire 480_2 may comprise a contiguous wire that extends from the left second terminal 420_2 via the first semiconductor chip 450 and the second semiconductor chip 460 to the right second terminal 430_2 as shown in FIGS. 4A and 4B. According to another example, individual bonding wires may be used for the connections left second terminal 420_2 to first semiconductor chip 450, first semiconductor chip 450 to second semiconductor chip 460 and second semiconductor chip 460 to right second terminal 430_2.

First terminals 420_1 and 430_1 may be integral parts of the respective carriers 440_1 and 440_2 as shown in FIG. 4A. Second terminals 420_2 and 430_2 may comprise one terminal each exposed from encapsulation body 410 as shown in FIG. 4A or may alternatively comprise any suitable number of terminals, for example two terminals each (e.g. as shown in FIG. 5 with respect to terminals 520_1, 530_1) such that semiconductor device 400 would have four terminals in each row of terminals 420, 430.

FIG. 4B shows a side view of the semiconductor device 400 along line A-A'. The at least one second bonding wire 480_2 may form a first loop between the left second terminal 420_2 to the first semiconductor chip 450, a second loop between the first semiconductor chip 450 and the second semiconductor chip 460 and a third loop between the second semiconductor chip 460 and the right second terminal 430_2.

FIG. 5 shows an example of a semiconductor device 500 according to the disclosure. The semiconductor device 500 may be similar to the semiconductor devices 300, 300' and 400, except for the fact that the semiconductor device 500 requires only one semiconductor chip 550 to realize a bidirectional switch. The semiconductor device 500 may comprise an encapsulation body 510, a first row of terminals 520, a second row of terminals 530 and a carrier 540. The semiconductor chip 550 may be a III-V semiconductor, for example GaN.

The semiconductor chip 550 comprises first electrodes 550_1 coupled to first terminals 520_1, 530_1 and second terminals 520_2, 530_2 and second electrodes 550_2 coupled to third terminals 520_3, 530_3. The semiconductor chip 550 may further comprise a third electrode 550_3 arranged on its lower main face. The third electrode 550_3 may be coupled to the carrier 540.

The semiconductor chip 550 may further comprise a fourth electrode 550_4 which may be arranged on the same main face of the semiconductor chip 550 as the first and second electrodes 550_1, 550_2 and which may be coupled to the carrier 540, for example by a bonding wire.

According to an example the first electrodes 550_1 may be drain electrodes. The third electrode 550_3 may be a source electrode. According to another example the first electrodes 550_1 may be source electrodes. The third electrode 550_3 may be a drain electrode. According to an example the second electrodes 550_2 may be gate electrodes.

The first terminals 520_1, 530_1 may be power terminals (e.g. drain terminals or source terminals) of the semiconductor device 500. The second terminals 520_2, 530_2 may be sensing terminals of the semiconductor device 500. The third terminals 520_3, 530_3 may be gate terminals of the semiconductor device 500.

While the disclosure has been illustrated and described with respect to one or more implementations, alterations and/or modifications may be made to the illustrated examples without departing from the spirit and scope of the appended claims. In particular regard to the various functions performed by the above described components or structures, the terms used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device forming a bidirectional switch, the semiconductor device comprising:
    a carrier;
    a first semiconductor chip and a second semiconductor chip arranged on the same carrier;
    a first row of terminals arranged along a first side face of the carrier;
    a second row of terminals arranged along a second side face of the carrier opposite the first side face; and
    an encapsulation body encapsulating the first and the second semiconductor chips,
    wherein the first semiconductor chip comprises a first transistor structure comprising first source, drain and gate electrodes,
    wherein the second semiconductor chip comprises a second transistor structure comprising second source, drain and gate electrodes,
    wherein the drain electrode of the first semiconductor chip and the drain electrode of the second semiconductor chip are connected to the same carrier such that the first and the second transistor structures are only electrically coupled by the respective first and second drain electrodes via the carrier,
    wherein the first row of terminals comprises a first gate terminal coupled with the first gate electrode, a first sensing terminal coupled with the first source electrode, and a first power terminal of the bidirectional switch coupled with the first source electrode,
    wherein the second row of terminals comprises a second gate terminal coupled with the second gate electrode, a second sensing terminal coupled with the second source electrode, and a second power terminal of the bidirectional switch coupled with the second source electrode,
    wherein the carrier and the first and the second rows of terminals are parts of a leadframe.

2. The semiconductor device of claim 1, wherein the first and the second semiconductor chips are implemented monolithically.

3. The semiconductor device of claim 1, wherein the first and the second semiconductor chips are identical semiconductor chips.

4. The semiconductor device of claim 1, wherein the first and the second semiconductor chips are arranged on a first main face of the carrier, and wherein a second main face of the carrier opposite the first main face is exposed from the encapsulation body.

5. The semiconductor device of claim 1, wherein the first and the second rows of terminals are physically separated from the carrier.

6. The semiconductor device of claim 1, wherein the first and the second semiconductor chips are soldered to the same carrier, and wherein the first and the second semiconductor chips are laterally spaced apart by a distance such that solder bleed-out of a first solder deposit for the first semiconductor chip does not commingle with solder bleed-out of a second solder deposit for the second semiconductor chip.

* * * * *